US012787608B2

(12) United States Patent
Long et al.

(10) Patent No.: US 12,787,608 B2
(45) Date of Patent: Nov. 3, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Zaiyong Long, Beijing (CN); Ge Wang, Beijing (CN); Kai Zhang, Beijing (CN); Zhiliang Jiang, Beijing (CN); Erlong Song, Beijing (CN); Wenbo Hu, Beijing (CN); Huaping Sun, Beijing (CN); Xiaomin Yuan, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 331 days.

(21) Appl. No.: 18/576,344

(22) PCT Filed: May 22, 2023

(86) PCT No.: PCT/CN2023/095513
§ 371 (c)(1),
(2) Date: Jan. 3, 2024

(87) PCT Pub. No.: WO2023/226930
PCT Pub. Date: Nov. 30, 2023

(65) Prior Publication Data

US 2024/0315114 A1 Sep. 19, 2024

(30) Foreign Application Priority Data

May 24, 2022 (CN) ........................ 202210587290.9

(51) Int. Cl.
*H10K 59/80* (2023.01)
*H10K 59/40* (2023.01)

(52) U.S. Cl.
CPC .......... *H10K 59/873* (2023.02); *H10K 59/40* (2023.02)

(58) Field of Classification Search
CPC ................ H10K 59/873; H10K 59/40; H10K 2102/311; H10K 50/80; H10K 59/00;
(Continued)

(56) References Cited

U.S. PATENT DOCUMENTS

| | | | | |
|---|---|---|---|---|
| 2018/0033980 A1* | 2/2018 | Park | ..................... | H10K 10/476 |
| 2018/0095571 A1* | 4/2018 | Park | ..................... | G06F 3/0412 |

(Continued)

FOREIGN PATENT DOCUMENTS

| | | |
|---|---|---|
| CN | 106816551 A | 6/2017 |
| CN | 108711565 A | 10/2018 |

(Continued)

OTHER PUBLICATIONS

PCT/CN2023/095513 international search report.
PCT/CN2023/095513 Written Opinion.
CN2022105872909 first office action dated Jun. 26, 2026.

*Primary Examiner* — Jarrett J Stark
(74) *Attorney, Agent, or Firm* — IPro, PLLC

(57) ABSTRACT

A display substrate includes a display area and a non-display area which includes a bending area. An outer edge area of the non-display area is a cutting reserve area, and at least
(Continued)

part of the cutting reserve area is located between the display area and the bending area. A light-emitting device layer is located on a base substrate and in the display area. An encapsulation layer is located on a side of the light-emitting device layer away from the base substrate. A touch layer is located on a side of the encapsulation layer away from the base substrate. A first organic layer is located on a side of the touch layer away from the base substrate. One or more blocking portions are located on at least one side of the display area, located between the display area and the bending area, and partially located in the cutting reserve area.

19 Claims, 7 Drawing Sheets

(58) Field of Classification Search
CPC ............... H10K 59/122; H10K 77/111; H10K 50/8428; H10K 50/844; Y02E 10/549
See application file for complete search history.

(56) References Cited

U.S. PATENT DOCUMENTS

| | | | | |
|---|---|---|---|---|
| 2020/0006703 | A1 | 1/2020 | Zhang et al. | |
| 2020/0350301 | A1* | 11/2020 | Zhai | H10K 59/121 |
| 2020/0363905 | A1* | 11/2020 | Jo | G06F 3/0448 |
| 2020/0411598 | A1* | 12/2020 | Gwon | G06F 3/0412 |
| 2021/0005696 | A1* | 1/2021 | Bang | H10K 59/1213 |
| 2021/0242426 | A1* | 8/2021 | Cheng | H10K 50/86 |
| 2022/0320239 | A1 | 10/2022 | Wei et al. | |

FOREIGN PATENT DOCUMENTS

| | | | | |
|---|---|---|---|---|
| CN | 109449186 | A | 3/2019 | |
| CN | 110444683 | A | 11/2019 | |
| CN | 111430566 | A | 7/2020 | |
| CN | 113377229 | A | 9/2021 | |
| CN | 113571561 | A * | 10/2021 | H10K 59/40 |
| CN | 113767475 | A | 12/2021 | |
| CN | 216980613 | U | 7/2022 | |
| CN | 114975829 | A * | 8/2022 | H10K 50/80 |
| CN | 116419592 | A | 7/2023 | |
| KR | 20210084990 | A | 7/2021 | |

* cited by examiner

DISPLAY SUBSTRATE AND DISPLAY APPARATUS

CROSS REFERENCE TO RELATED APPLICATIONS

This application is a U.S. national phase application of International Application No. PCT/CN2023/095513, filed on May 22, 2023, which claims priority to Chinese Patent Application No. 202210587290.9 filed on May 24, 2022 to CNIPA, the disclosure of which is incorporated herein by reference in its entirety for all purposes.

TECHNICAL FIELD

The present disclosure relates to the field of display technology, and in particular to a display substrate and a display apparatus.

BACKGROUND

In related technologies, a flexible organic light-emitting diode (OLED) display substrate has many advantages, such as foldable, bendable, and narrow bezel. The flexible OLED display substrate includes a flexible base substrate, a driving circuit, a light-emitting device layer, and an encapsulation layer. The flexible encapsulation layer has a sandwich structure: two inorganic layers and an organic layer located between the two inorganic layers. The organic layer is made by printing. The initial form of the organic layer is liquid. When the organic layer flows to an edge of the display substrate, a slope will be formed. If the slope enters a display area of the display substrate, a light path will be affected, resulting in wave patterns in the edge area of the display substrate during display.

SUMMARY

The present disclosure provides a display substrate and a display apparatus.

According to a first aspect of the embodiments of the present disclosure, there is provided a display substrate. The display substrate includes a display area and a non-display area, and the non-display area includes a bending area; an outer edge area of the non-display area is a cutting reserve area, and at least part of the cutting reserve area is located between the display area and the bending area. The display substrate includes:

- a base substrate;
- a light-emitting device layer, located on the base substrate and in the display area;
- an encapsulation layer, located on a side of the light-emitting device layer away from the base substrate;
- a touch layer, located on a side of the encapsulation layer away from the base substrate;
- a first organic layer, located on a side of the touch layer away from the base substrate, and in the display area and the non-display area; and
- one or more blocking portions located on at least one side of the display area, where the one or more blocking portions are located between the display area and the bending area, and are partially located in the cutting reserve area to prevent the first organic layer from entering the bending area.

In an embodiment, the one or more blocking portions are located on a side of the first organic layer away from the display area.

In an embodiment, heights of the one or more blocking portions are greater than a height of an edge of the first organic layer away from the display area; or, the heights of the one or more blocking portions are smaller than the height of the edge of the first organic layer away from the display area.

In an embodiment, in a direction perpendicular to a direction in which the display area pointing to the bending area, the cutting reserve area includes a first edge and a second edge which are opposite, the first edge and the second edge are located on opposite sides of the non-display area, and the one or more blocking portions extend from the first edge to the second edge.

In an embodiment, a distance between a surface of a part of the one or more blocking portions located in the cutting reserve area away from the base substrate and the base substrate is a first distance, a distance between a surface of a part of the one or more blocking portions located outside the cutting reserve area away from the base substrate and the base substrate is a second distance, and the first distance is less than the second distance.

In an embodiment, the display substrate includes a plurality of organic layers, and a part of the one or more blocking portions located in the cutting reserve area includes at least two organic layers.

In an embodiment, the display substrate further includes a second organic layer located between the touch layer and the first organic layer, a planarization layer located on a side of the touch layer towards the base substrate, and a pixel defining layer included in the light-emitting device layer;

- where the part of the one or more blocking portions located in the cutting reserve area at least includes a part of at least two of the second organic layer, the planarization layer and the pixel defining layer.

In an embodiment, the first organic layer is formed by an inkjet printing process, and the second organic layer is made of an organic resin.

In an embodiment, the display substrate further includes one or more blocking blocks located in the cutting reserve area, where the one or more blocking blocks are located on a side of the one or more blocking portions away from the bending area.

In an embodiment, widths of the one or more blocking blocks are the same as a width of the cutting reserve area.

In an embodiment, settings of one or more layers for the one or more blocking blocks and the one or more blocking portions are the same.

In an embodiment, the encapsulation layer includes an organic encapsulation layer at least partially located in the display area; where the one or more blocking portions are located on a side of the organic encapsulation layer away from the display area; the organic encapsulation layer includes a slope portion which is uneven in thickness.

In an embodiment, the first organic layer includes an optical compensation portion, a projection of the slope portion on the base substrate is located within a projection of the optical compensation portion on the base substrate, and the optical compensation portion is configured to weaken or eliminate a phenomenon of wave patterns on a display screen caused by the slope portion.

In an embodiment, sums of a thickness of the optical compensation portion and a thickness of the slope portion at different positions in the display area are basically the same, a refractive index of the slope portion is the same as a refractive index of the optical compensation portion, and a surface of the optical compensation portion away from the base substrate is parallel to a surface of the base substrate facing the light-emitting device layer.

In an embodiment, a material of the organic encapsulation layer is the same as a material of the optical compensation portion.

In an embodiment, the organic encapsulation layer further includes a first flat portion located in the display area and adjacent to the slope portion, where the first flat portion is even in thickness;

the organic encapsulation layer further includes a second flat portion located in the display area and adjacent to the optical compensation portion, where the second flat portion is located on a side of the first flat portion away from the base substrate, and a surface of the second flat portion away from the base substrate is parallel to a surface of the base substrate facing the light-emitting device layer; sums of a thickness of the first organic layer and a thickness of the organic encapsulation layer at different positions in the display area are basically the same.

In an embodiment, the touch layer includes a first metal layer, an insulating material layer located on a side of the first metal layer away from the base substrate, and a second metal layer located on a side of the insulating material layer away from the base substrate; where the insulating material layer covers the first metal layer; the display substrate further includes a second organic layer located between the touch layer and the first organic layer, where the second organic layer is located between the display area and the non-display area and outside the bending area, and the second organic layer covers the second metal layer;

where a part of the one or more blocking portions located outside the cutting reserve area includes a part of at least one of the first metal layer, the insulating material layer, the second metal layer and the second organic layer.

In an embodiment, a distance between the one or more blocking portions and the bending area is less than a distance between the one or more blocking portions and the display area.

In an embodiment, the encapsulation layer includes an organic encapsulation layer at least partially located in the display area, and the display substrate further includes one or more dams located in the non-display area and on a side of the one or more blocking portions near the display area, where the one or more dams are for preventing an organic material for preparing the organic encapsulation layer from overflowing to the non-display area; where the one or more dams and the one or more blocking portions do not overlap in a direction perpendicular to the base substrate;

where a distance between the one or more blocking portions and the one or more dams is smaller than a distance between the one or more blocking portions and the bending area.

According to a second aspect of the embodiments of the present disclosure, there is provided a display apparatus including the aforementioned display substrate.

In the display substrate and display apparatus provided by the embodiments of the present disclosure, the first organic layer on the side of the touch layer away from the substrate is located in the display area and the non-display area, so that a difference between a total thickness of the first organic layer and the encapsulation layer in an edge area of the display area and a total thickness of the first organic layer and the encapsulation layer in other area of the display area are small, thereby improving the display effect of the edge area of the display area and improving the display quality of the display substrate. Since the blocking portions on the at least one side of the display area are located between the display area and the bending area, and partially located in the cutting reserve area, the part of the blocking portions located in the cutting reserve area can prevent the material of the organic layer in the encapsulation layer and the material of the first organic layer from overflowing from the display area through the cutting reserve area. The blocking portions can more effectively block the material of the organic layer in the encapsulation layer and the material of the first organic layer from overflowing from the display area, effectively reducing the difference between the total thickness of the first organic layer and the encapsulation layer in the edge area of the display area and the total thickness of the first organic layer and the encapsulation layer in other area of the display area, thus contributing to improve display quality. Moreover, the setting of the blocking portion can improve the problem of increasing the thickness of film layers in the bending area caused by the material of the first organic layer flowing into the bending area, thereby causing cracks in the film layers or line breakage in the bending area during the bending process, thus improving the yield of the display substrate.

It should be understood that the above general description and the following detailed description are only exemplary and explanatory, and are not restrictive of the present disclosure.

BRIEF DESCRIPTION OF THE DRAWINGS

The accompanying drawings, which are incorporated into and constitute a part of the specification, illustrate embodiments consistent with the present disclosure and serve to explain the principles of the present disclosure together with the specification.

DETAILED DESCRIPTION OF THE EMBODIMENTS

Exemplary embodiments will be described in detail herein, examples of which are illustrated in the accompanying drawings. When the following description refers to the drawings, unless otherwise indicated, the same numerals in different drawings indicate the same or similar elements. The exemplary embodiments described below do not represent all embodiments consistent with the present disclosure. Rather, they are merely examples of apparatus and method consistent with some aspects of the embodiments of the present disclosure, as recited in the appended claims.

Terms used in the present disclosure are for the purpose of describing specific embodiments only, and are not intended to limit the present disclosure. The singular forms "a/an", "the" and "this" used in the embodiments of the present disclosure and the appended claims are also intended to include plural forms, unless the context clearly indicates other meanings. It should also be understood that the term "and/or" as used herein refers to and includes any and all possible combinations of one or more of the associated listed items.

It should be understood that although terms first, second, third, etc. may be used in the embodiments of the present disclosure to describe various information, such information should not be limited to these terms. These terms are only used to distinguish the same type of information from each other. For example, first information may also be referred to as second information, and similarly, the second information may also be referred to as the first information without departing from the scope of the present disclosure. Depending on the context, the word "if" as used herein can be interpreted as "at the time of", "when" or "in response to determining".

Embodiments of the present disclosure provide a display substrate and a display apparatus. Next, the display substrate and display apparatus in the embodiments of the present application will be described in detail with reference to the accompanying drawings. In case of no conflict, features in the following embodiments can complement each other or be combined with each other.

Figure 1:
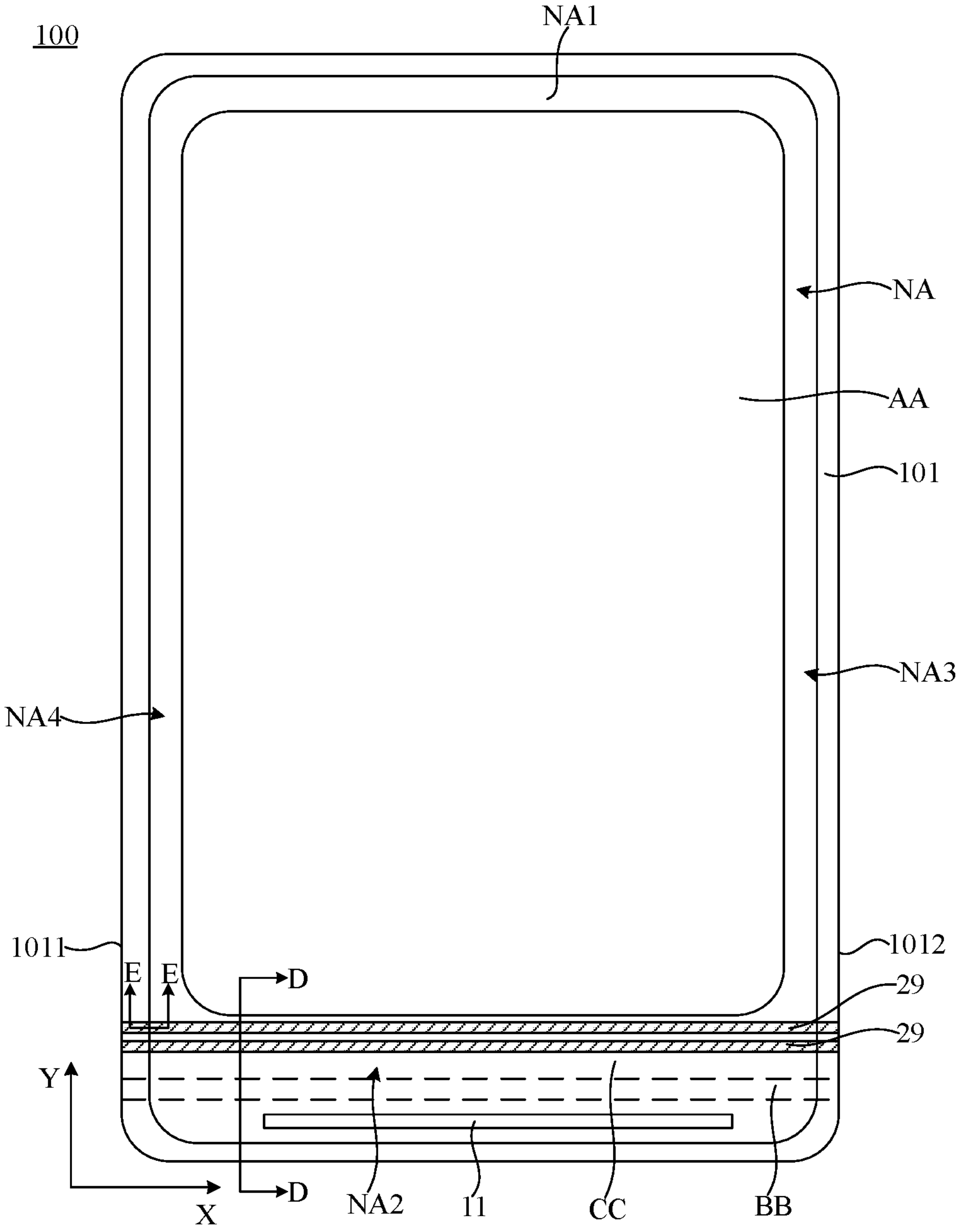
FIG. 1 is a schematic structural diagram of a display substrate according to an exemplary embodiment of the present disclosure.
Figure 2:
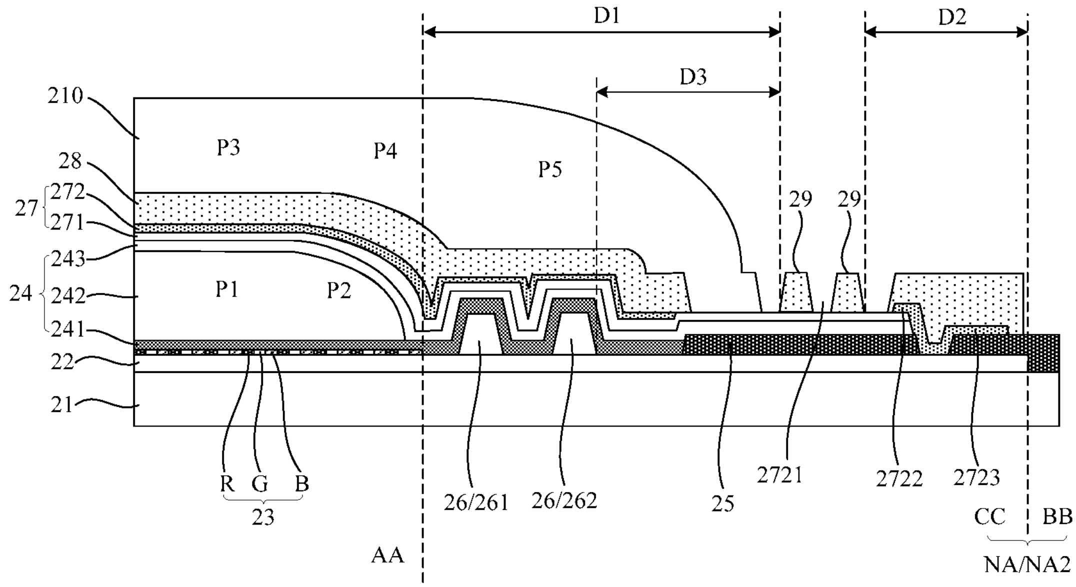
FIG. 2 is a sectional view of the display substrate shown in FIG. 1 taken along a sectional line DD.

An embodiment of the present disclosure provides a display substrate. As shown in FIGS. 1 and 2, the display substrate 100 includes a display area AA and a non-display area NA which is adjacent to the display area AA. The non-display area NA area includes a bending area BB. An outer edge area of the non-display area NA is a cutting reserve area 101. At least part of the cutting reserve area 101 is located between the display area AA and the bending area BB.

The display substrate 100 includes a base substrate 21, a light-emitting device layer 23, an encapsulation layer 24, a touch layer 27, a first organic layer 210 and a blocking portion 29. The light-emitting device layer 23 is located on the base substrate 21 and in the display area AA. The encapsulation layer 24 is located on a side of the light-emitting device layer 23 away from the base substrate 21. The touch layer 27 is located on a side of the encapsulation layer 24 away from the base substrate 21. The first organic layer 210 is located on a side of the touch layer 27 away from the base substrate 21, and is located in the display area AA and the non-display area NA. The blocking portion 29 is located on at least one side of the display area AA. The blocking portion 29 is located between the display area AA and the bending area BB, and is partially located in the cutting reserve area 101 to prevent the first organic layer 210 from entering the bending area BB.

In the display substrate provided in the embodiment of the present disclosure, the first organic layer 210 is located on the side of the touch layer 27 away from the base substrate 21, and the first organic layer 210 is located in the display area AA and the non-display area NA, so that a difference between a total thickness of the first organic layer 210 and the encapsulation layer 24 in an edge area of the display area AA and a total thickness of the first organic layer 210 and the encapsulation layer 24 in other area of the display area are small, thereby improving the display effect of the edge area of the display area AA and improving the display quality of the display substrate. Since the blocking portion 29 on the at least one side of the display area AA is located between the display area AA and the bending area BB, and partially located in the cutting reserve area 101, the part of the blocking portion 29 located in the cutting reserve area 101 can prevent the material of the organic layer in the encapsulation layer 24 and the material of the first organic layer 210 from overflowing from the display area AA through the cutting reserve area 101. The blocking portion 29 can more effectively block the material of the organic layer in the encapsulation layer 24 and the material of the first organic layer 210 from overflowing from the display area AA, effectively reducing the difference between the total thickness of the first organic layer 210 and the encapsulation layer 24 in the edge area of the display area and the total thickness of the first organic layer 210 and the encapsulation layer 24 in a central area of the display area, thus contributing to improve display quality. Moreover, the setting of the blocking portion 29 can improve the problem of increasing the thickness of film layers in the bending area BB caused by the material of the first organic layer 210 flowing into the bending area BB, thereby causing cracks in the film layers or line breakage in the bending area BB during the bending process, thus improving the yield of the display substrate.

In the process of preparing a display substrate, a plurality of display substrates are prepared at the same time, and the plurality of display substrates share a relatively large base substrate. Then cutting is performed to obtain the plurality of independent display substrates. Each display substrate corresponds to a annular cutting area which indicates a cutting path. Considering the existence of a cutting error, the width of the cutting area is generally large. After the cutting is completed, there will be some cutting areas reserved in the edge area of the display substrate, which is the cutting reserve area of the display substrate. As shown in FIG. 1, the cutting reserve area 101 is the outermost edge area of the non-display area NA of the display substrate 100, and the cutting reserve area 101 is annular.

In an embodiment, as shown in FIG. 1, the non-display area NA includes a first non-display area NA1, a second non-display area NA2, a third non-display area NA3, and a fourth non-display area NA4. The first non-display area NA1 and the second non-display area NA2 are located on two sides of the display area AA, and are opposite in a first direction Y. The third non-display area NA3 and the fourth non-display area NA4 are located on the other two sides of the display area AA, and are opposite in a second direction X. The cutting reserve area 101 is partially located in the first non-display area NA1, partially in the second non-display area NA2, partially in the third non-display area NA3, and partially in the fourth non-display area NA4.

The second non-display area NA2 includes a fan-out area CC and a bending area BB. The fan-out area CC is located between the display area AA and the bending area BB. A plurality of signal lines, for example, data signal lines, touch signal lines and power signal lines, are arranged in the fan-out area CC. The second non-display area NA2 is also provided with a driver chip 11, which is located on a side of the bending area BB away from the display area AA. The bending area BB can be bent to arrange the driver chip 11 on a side of the display substrate facing back to a light-emitting surface. The blocking portion 29 is partially located in the fan-out area CC of the second non-display area NA2, and partially located in an area between the display area AA and the bending area BB of the cutting reserve area 101. The area between the display area AA and the bending area BB of the cutting reserve area 101 refers to an area of the cutting reserve area 101 located in the second non-display area NA2 and on a side of the bending area BB towards the display area AA.

Figure 3:
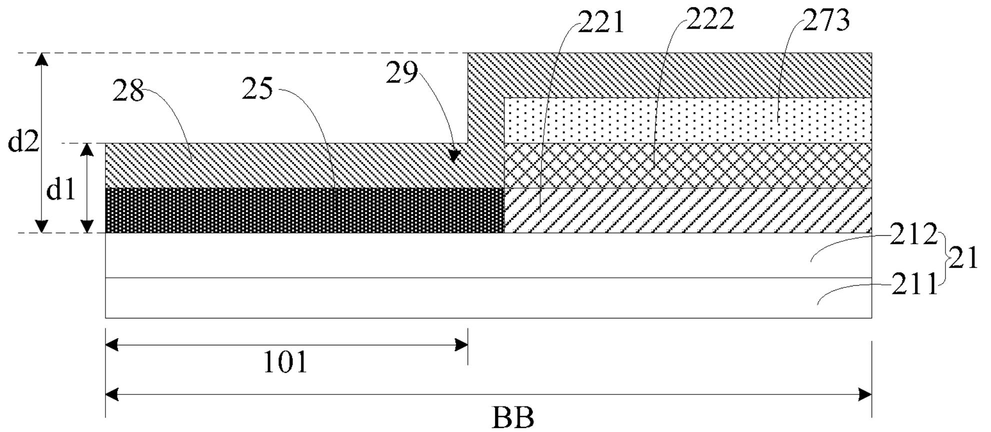
FIG. 3 is a sectional view of the display substrate shown in FIG. 1 taken along a sectional line EE.
Figure 4:
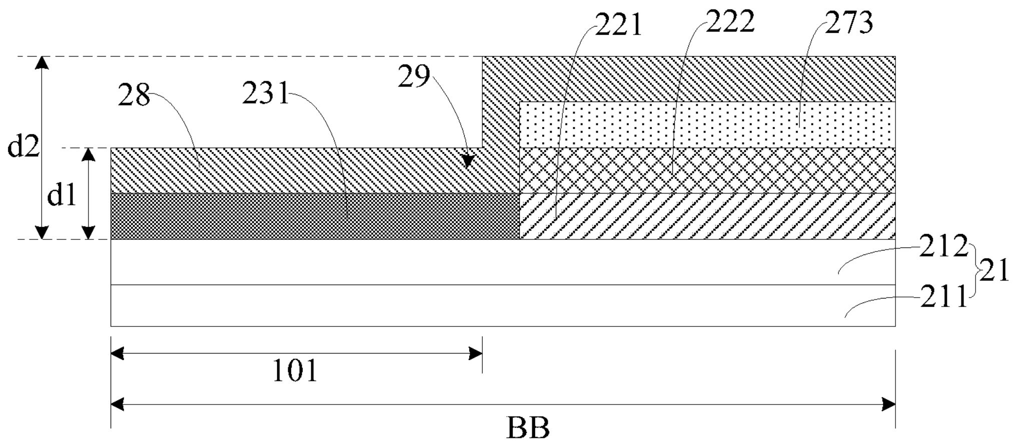
FIG. 4 is another sectional view of the display substrate shown in FIG. 1 taken along a sectional line EE.
Figure 5:
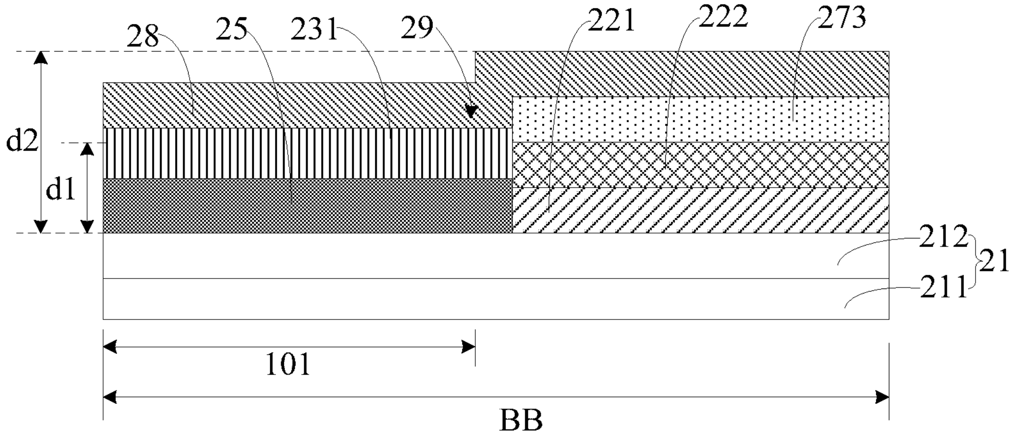
FIG. 5 is yet another sectional view of the display substrate shown in FIG. 1 taken along a sectional line EE.

In an embodiment, as shown in FIGS. 3 to 5, the base substrate 21 includes a substrate body 211 and a buffer layer 212 located on a side of the substrate body 211 facing the light-emitting device layer 23. The substrate body 211 can be a flexible base substrate or a rigid base substrate. The flexible base substrate can be made of one or more of polyimide, polyethylene terephthalate and polycarbonate. The rigid base substrate can be made of glass, silicon, etc. The buffer layer 212 can be made of at least one of silicon nitride and silicon oxide.

In an embodiment, as shown in FIG. 2, the display substrate further includes a driving circuit layer 22 located between the base substrate 21 and the light-emitting device layer 23. The driving circuit layer 22 includes a plurality of pixel circuits for driving sub-pixels. The pixel circuits can include thin film transistors and capacitors. For example, the pixel circuits can be 2T1C pixel circuits, 3T1C pixel circuits, 4T1C pixel circuits, 5T1C pixel circuits, 6T1C pixel circuits, or 7T1C pixel circuits.

The driving circuit layer 22 may include at least one insulating layer. The at least one insulating layer includes, for example, an interlayer dielectric layer and a passivation layer for achieving insulation between adjacent conductive layers in the driving circuit layer. The interlayer dielectric layer is located on a side of the passivation layer away from the base substrate 21. The interlayer dielectric layer and the passivation layer can be made of an inorganic insulating material, including at least one of silicon nitride and silicon oxide, for example.

In an embodiment, the display substrate further includes a planarization layer 25, which is located on a side of the driving circuit layer 22 away from the base substrate 21. The planarization layer 25 is at least partially located in the non-display area NA. A part of the planarization layer 25 located in the non-display area NA is between the driving circuit layer 22 and the touch layer 27 for separating the driving circuit layer 22 from the touch layer 27. The planarization layer 25 is made of an organic insulating material.

In an embodiment, as shown in FIG. 2, the light-emitting device layer 23 includes sub-pixels with at least three different light-emitting colors. The light-emitting device layer 23 can include red sub-pixels R, green sub-pixels G, and blue sub-pixels B, but is not limited to thereto. The red sub-pixels R emit red light, the green sub-pixels G emit green light, and the blue sub-pixel B emit blue light. Light-emitting material layers of the sub-pixels of the light-emitting device layer 23 can be an organic light-emitting layer. The red sub-pixels R, the green sub-pixels G, and the blue sub-pixels B are all organic light-emitting diode (OLED) sub-pixels.

In some embodiments, as shown in FIG. 4, the light-emitting device layer 23 further includes a pixel defining layer 231. The pixel defining layer is provided with a plurality of pixel openings, which correspond to the sub-pixels one by one. The light-emitting material layer of each sub-pixel is at least partially located in the corresponding pixel opening.

In some embodiments, as shown in FIG. 2, the encapsulation layer 24 is located on the side of the light-emitting device layer 23 away from the base substrate 21 to prevent water and oxygen from eroding the light-emitting device layer 23. The encapsulation layer 24 can include inorganic encapsulation layers and organic encapsulation layers alternately arranged. The film layer farthest from the base substrate 21 in the encapsulation layer 24 is an inorganic encapsulation layer.

In some embodiments, the encapsulation layer 24 includes a first inorganic encapsulation layer 241, an organic encapsulation layer 242, and a second inorganic encapsulation layer 243. The first inorganic encapsulation layer 241 is located on a side of the light-emitting device layer 23 away from the base substrate 21, the organic encapsulation layer 242 is located on a side of the first inorganic encapsulation layer 241 away from the base substrate 21, and the second inorganic encapsulation layer 243 is located on a side of the organic encapsulation layer 242 away from the base substrate 21. The organic encapsulation layer 242 can be formed by an inkjet printing (IJP) process.

In some embodiments, as shown in FIG. 2, a part of the first inorganic encapsulation layer 241 and a part of the second inorganic encapsulation layer 243 are located in the display area AA. Another part of the first inorganic encapsulation layer 241 and another part of the second inorganic encapsulation layer 243 are located in the non-display area NA. The organic encapsulation layer 242 is at least partially located in the display area AA.

In some embodiments, as shown in FIG. 2, the organic encapsulation layer 242 includes a first flat portion P1 and a slope portion P2, both of which are located in the display area AA. The first flat portion P1 is adjacent to the slope portion P2. The slope portion P2 surrounds the first flat portion P1. That is, the first flat portion P1 is located inside the slope portion P2. The thickness of the first flat portion P1 is even throughout. The thickness of the slope portion P2 is uneven throughout. For example, the thickness of the slope portion P2 gradually decreases in a direction from the first flat portion P1 to the slope portion P2. The structure of the slope portion P2 will cause interference. The organic encapsulation layer 242 has the slope P2 around it, which will cause a screen displayed in the edge area of the display area to appear wave patterns.

In an embodiment, the blocking portion 29 is located on a side of the organic encapsulation layer 242 away from the display area AA. In this way, the blocking portion 29 can prevent the organic encapsulation layer 242 from overflowing from the display area and flowing to the bending area BB, which is more helpful in reducing the difference between the total thickness of the first organic layer and the encapsulation layer at the edge of the display area and the total thickness of the first organic layer and the encapsulation layer at the center of the display area, and improving the problem of cracks in film layers or line breakage in the bending area BB during the bending process.

In some embodiments, as shown in FIG. 2, the touch layer 27 is located in the display area AA and the non-display area NA. The touch layer 27 includes a touch electrode and a touch signal line. The touch electrode is located in the display area AA. A part of the touch signal line located in the display area AA and the other part is located in the non-display area NA.

In an embodiment, as shown in FIGS. 2 and 3, the touch layer 27 includes a first metal layer 271, an insulating material layer 273, and a second metal layer 272. The first metal layer 271 is located on a side of the encapsulation layer 24 away from the base substrate 21. The insulating material layer is located on a side of the first metal layer 271 away from the base substrate 21, and covers the first metal layer 271. The second metal layer 272 is located on a side of the insulating material layer away from the base substrate 21.

In some embodiments, as shown in FIG. 2, in some areas of the fan-out area CC, one of the first metal layer 271 and the second metal layer 272 can be used for wiring. For example, the fan-out area CC is routed through the first metal layer 271 on the side near the display area AA. The fan-out area CC is routed through the second metal layer 272 on the side near the bending area BB. The second metal layer 272 and the first metal layer 271 located in the fan-out area CC can be connected by lap.

In some embodiments, as shown in FIG. 2, the second metal layer 272 includes a hollow portion 2721, a lap portion 2722, and a wiring portion 2723. The lap portion 2722 is located on a side of the hollow portion 2721 away from the display area AA. The wiring portion 2723 is located on a side of the lap portion 2722 away from the display area AA. The lap portion 2722 is connected to the first metal layer 271 by lap. The wiring portion 2723 is connected to the lap portion 2722. That is, the second metal layer 272 is electrically connected to the first metal layer 271 through the lap portion 2722.

In some embodiments, the display substrate further includes a second organic layer 28 located between the touch layer 27 and the first organic layer 210. The second organic layer 28 is located in the display area AA and the non-display area NA, and is located outside the bending area BB. The second organic layer 28 covers the second metal layer 272 to protect the second metal layer 272. The second organic layer 28 also plays a role of planarization. The second organic layer 28 is located outside the bending area BB, so that the second organic layer 28 will not increase the thickness of film layers inside the bending area BB. The second organic layer 28 can be made of an organic resin.

In an embodiment, the first organic layer 210 can be formed by an inkjet printing (IJP) process. The first organic layer 210 includes a second flat portion P3, an optical compensation portion P4, and an edge portion P5. The second flat portion P3 and the optical compensation portion P4 are located in the display area AA. The second flat portion P3 is adjacent to the optical compensation portion P4, and the optical compensation portion P4 surrounds the second flat portion P3. The edge portion P5 is located in the non-display area NA. The edge portion P5 is adjacent to the optical compensation portion P4, and the edge portion P5 surrounds the optical compensation portion P4.

In some embodiments, as shown in FIG. 2, the second flat portion P3 is located on a side of the first flat portion P1 away from the base substrate 21. A surface of the second flat portion P3 away from the base substrate 21 is parallel to a surface of the base substrate 21 facing the light-emitting device layer 23. In this way, sums of thicknesses of the first flat portion P1 and the second flat portion P3 at different positions in the display area are basically the same, which can avoid the problem of poor display quality due to a large difference in the optical path of light emission caused by a large difference in thickness. The sums of the thicknesses of the first flat portion P1 and the second flat portion P3 are basically the same, which means that the sums of the thicknesses of the first flat portion P1 and the second flat portion P3 at different positions in the display area are the same, and a difference in the sums of the thicknesses of the first flat portion P1 and the second flat portion P3 at different positions in the display area is very small.

In some embodiments, as shown in FIG. 2, a projection of the slope portion P2 on the base substrate 21 is located within a projection of the optical compensation portion P4 on the base substrate 21. The optical compensation portion P4 is configured to weaken or eliminate a phenomenon of wave patterns on a display screen caused by the slope portion P2.

In some embodiments, as shown in FIG. 2, sums of a thickness of the optical compensation portion P4 and the thickness of the slope portion P2 at different positions in the display area AA are basically the same. A refractive index of the slope portion P2 is the same as that of the optical compensation portion P4. In this way, when the light-emitting device layer 23 emits light, optical paths of emitting lights emitted from the optical compensation portion P4 are basically the same at different positions in the display area, which can weaken or eliminate the phenomenon of wave patterns on the display screen and improve the display quality.

In some embodiments, as shown in FIG. 2, a surface of the optical compensation unit P4 away from the base substrate 21 is parallel to the surface of the base substrate 21 facing the light-emitting device layer 23. The surface of the optical compensation portion P4 away from the base substrate 21 is flush with the surface of the second flat portion P3 away from the base substrate 21.

In some embodiments, sums of a thickness of the first organic layer 210 and a thickness of the organic encapsulation layer 242 at different positions in the display area AA are basically the same. The material of the organic encapsulation layer 242 is the same as that of the optical compensation portion P4. In this way, when the light-emitting device layer 23 emits light, optical paths of emitting lights emitted from the first organic layer 210 are basically the same at different positions in the display area, which can weaken or eliminate the phenomenon of wave patterns on the display screen and improve the display quality.

In some embodiments, as shown in FIG. 2, the edge portion P5 is located in the non-display area NA. For example, the edge portion P5 can be located in the first non-display area NA1, the second non-display area NA2, the third non-display area NA3, and the fourth non-display area NA4. The thickness of the edge portion P5 can be uneven throughout.

It should be noted that in some embodiments, the first organic layer 210 may include only the optical compensation portion P4 and the edge portion P5, but not the second flat portion P3.

In some embodiments, as shown in FIG. 2, when the edge portion P5 is located in the second non-display area NA2, the edge portion P5 is located outside the bending area BB. This setting can prevent the first organic layer 210 from affecting the bending performance of the display substrate in the bending area BB, and avoid adverse phenomena such as cracks in the film layers of the bending area BB or difficulty in bending.

In an embodiment, the first organic layer 210 covers at least part of the edge of the encapsulation layer 24. This setting is more conducive to reducing the difference between the total thickness of the first organic layer and the encapsulation layer in the edge area of the display area and the total thickness of the first organic layer and the encapsulation layer located in other area in the display area, and effectively improving the display effect of the display area.

In an embodiment, as shown in FIG. 2, the blocking portion 29 is located on a side of the first organic layer 210 away from the display area AA. In this way, the blocking portion 29 can more effectively block the organic material of the first organic layer 210 from overflowing in a direction away from the display area AA and entering the bending area BB.

In an embodiment, a height of the blocking portion 29 is greater than a height of an edge of the first organic layer 210 away from the display area AA. That is, the blocking portion 29 can effectively block the organic material of the first organic layer 210 from overflowing in the direction away from the display area AA.

In another embodiment, the height of the blocking portion 29 can be smaller than the height of the edge of the first organic layer 210 away from the display area AA. That is, part of the material of the first organic layer 210 overflows the blocking portion 29. In this case, the blocking portion 29 can block the part of the material of the first organic layer 210 on a side of the blocking portion 29 away from the bending area.

In an embodiment, in a direction perpendicular to a direction in which the display area AA pointing to the bending area BB, the cutting reserve area 101 includes a first edge 1011 and a second edge 1012 which are opposite. The first edge 1011 and the second edge 1012 are located on opposite sides of the non-display area NA. The blocking portion 29 extends from the first edge 1011 to the second edge 1012. That is, in the second direction X, the cutting reserve area 101 includes the first edge 1011 and the second edge 1012 which are opposite. The blocking portion 29 extends from the first edge 1011 to the second edge 1012, so that paths of the organic material of the first organic layer 210 overflowing to the bending area BB in the direction away from the display area AA are blocked by the blocking portion 29. The blocking portion 29 can more effectively prevent the organic material of the first organic layer 210 from flowing to the bending area BB.

In the embodiment shown in FIG. 2, all of the blocking portion 29 is located in the second non-display area NA2. In other embodiments, the blocking portion 29 may be partially located in the second non-display area NA2, and partially located in other areas of the non-display area. For example, the blocking portion 29 may be annular or semi-annular.

In an embodiment, as shown in FIGS. 3 to 5, a distance between a surface of a part of the blocking portion 29 located in the cutting reserve area 101 away from the base substrate 21 and the base substrate 21 is a first distance d1. A distance between a surface of a part of the blocking portion 29 located outside the cutting reserve area 101 away from the base substrate 21 and the base substrate 21 is a second distance d2. The first distance d1 is less than the second distance d2. In this way, the film thickness of the cutting reserve area 101 is smaller than that of other areas of the non-display area NA, which can reduce the difficulty of cutting when cutting the cutting area.

In an embodiment, the display substrate includes a plurality of organic layers, and a part of the blocking portion 29 located in the cutting reserve area 101 includes at least two organic layers. The blocking portion 29 includes one or more organic layers, which means that the blocking portion 29 includes a part of the organic layers. By setting of the part of the blocking portion 29 located in the cutting reserve area 101 including at least two organic layers, the distance between the part of the blocking portion 29 located in the cutting reserve area 101 and the base substrate 21 can be relatively large, which helps to improve the blocking effect of the blocking portion 29 on the organic material of the first organic layer 210. Moreover, the film layer located in the cutting reserve area 101 is an organic layer, which can reduce the difficulty of cutting the cutting area and prevent the film layer in the cutting area from generating cracks and extending to the display area during the cutting process, thereby affecting the service life of the display substrate.

In some embodiments, the part of the blocking portion 29 located in the cutting reserve area 101 is all made of an organic material. This setting is more helpful in avoiding cracks in the film layer of the cutting area during the cutting process.

In some embodiments, the part of the blocking portion 29 located in the cutting reserve area 101 at least includes a part of at least two of the second organic layer 28, the planarization layer 25 and the pixel defining layer 231. In this way, the blocking portion 29 is formed simultaneously with the organic layer of the display substrate, and the formation of the blocking portion will not increase the preparation complexity of the display substrate.

In an exemplary embodiment, as shown in FIG. 3, the part of the blocking portion 29 located in the cutting reserve area 101 includes the planarization layer 25 and a part of the second organic layer 28. In another exemplary embodiment, as shown in FIG. 4, the part of the blocking portion 29 located in the cutting reserve area 101 includes the pixel defining layer 231 and a part of the second organic layer 28. In another exemplary embodiment, as shown in FIG. 5, the part of the blocking portion 29 located in the cutting reserve area 101 includes the planarization layer 25, the pixel defining layer 231, and a part of the second organic layer 28.

In some embodiments, a part of the blocking portion 29 located outside the cutting reserve area 101 includes a part of at least one of the first metal layer 271, the insulating material layer 273, the second metal layer 272 of the touch layer 27 and the second organic layer 28. As shown in FIGS. 3 to 5, the part of the blocking portion 29 located outside the cutting reserve area 101 includes a part of the second organic layer 28, and an interlayer dielectric layer 221 and a passivation layer 222 of the driving circuit layer 22, and the insulating material layer 273 of the touch layer 27 are provided between the part of the blocking portion 29 located outside the cutting reserve area 101 and the base substrate 21. In this way, a distance between a surface of the part of the blocking portion 29 located outside the cutting reserve area 101 away from the substrate and the substrate is relatively large, which is more conducive to preventing the organic material of the first organic layer 210 from overflowing to the bending area BB. Moreover, the part of the blocking portion 29 located outside the cutting reserve area 101 is formed simultaneously with the second organic layer 28, and the formation of the blocking portion will not increase the complexity of the preparation process.

In an embodiment, the number of the blocking portion 29 is two or more. The two or more blocking portions 29 are arranged in sequence in the direction from the display area AA to the bending area BB. In this way, when the material for preparing the first organic layer 210 overflows from a blocking portion 29 near the display area AA, one or more other blocking portions 29 near the bending area BB can also prevent the material for preparing the first organic layer 210 from entering the bending area BB, thus improving the reliability of the blocking portion 29 in blocking the material of the first organic layer 210. In the embodiment shown in FIG. 2, the number of the blocking portion 29 is two. In other embodiments, the number of the blocking portion 29 can be greater than two.

In some embodiments, as shown in FIG. 2, there is a gap between two adjacent blocking portions 29. In this way, when the material for preparing the first organic layer 210 overflows from the blocking portion 29 near the display area AA, part of the material will stay in the gap between the two adjacent blocking portions 29, so that the amount of the material that continues to flow to the bending area BB is reduced, which is more helpful to prevent the material for preparing the first organic layer 210 from entering the bending area BB and improve the reliability of the blocking portion 29 in blocking the material of the first organic layer.

In some embodiments, when the number of the blocking portion 29 is two or more, the height of the part of each blocking portion 29 located in the cutting reserve area 101 may be the same, and the height of the part of each blocking portion 29 located outside the cutting reserve area 101 may be the same. This helps to simplify the complexity of the preparation process of the blocking portion 29 and reduce the preparation cost of the display substrate. In other embodiments, the height of the part of each blocking portion 29 located in the cutting reserve area 101 may not be all the same, and the height of the part of each blocking portion 29 located outside the cutting reserve area 101 may not be all the same. For example, when the number of the blocking portion 29 is two, the height of the part of the blocking portion near the display area AA located in the cutting reserve area 101 is smaller than that of the part of the blocking portion 29 near the bending area BB located in the cutting reserve area 101; the height of the part of the blocking portion near the display area AA located outside the cutting reserve area 101 is smaller than the height of the part of the blocking portion 29 near the bending area BB located outside the cutting reserve area 101.

Figure 6:
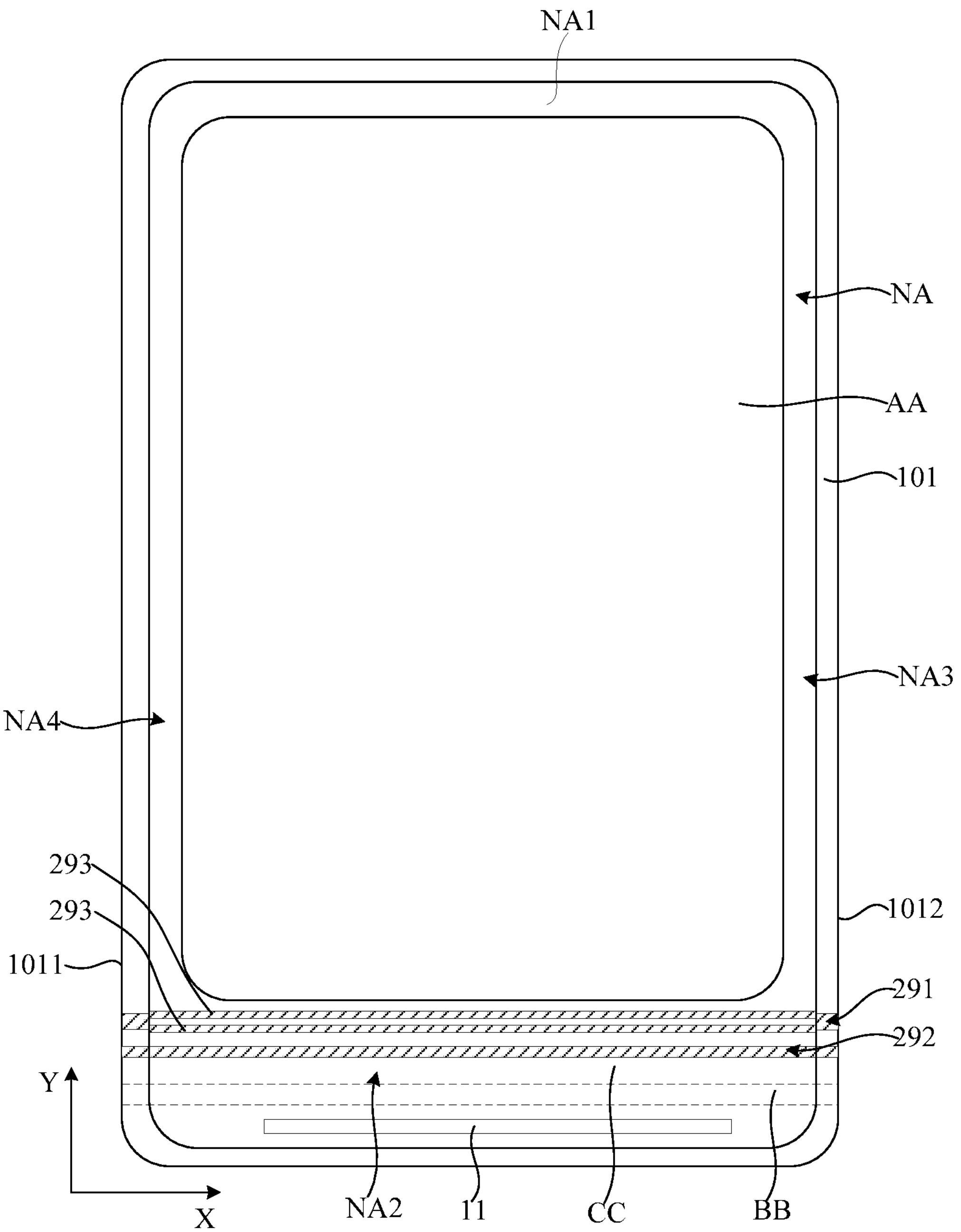
FIG. 6 is a schematic structural diagram of a display substrate according to another exemplary embodiment of the present disclosure.

In some embodiments, as shown in FIG. 6, a part of at least one blocking portion 29 of the display substrate located outside the cutting reserve area 101 is bifurcated to form two sub-blocking portions 293, and two sides of the blocking portion 29 can be basically symmetrical. This setting is more helpful in preventing the material for preparing the first organic layer 210 from entering the bending area BB. When the display substrate includes two or more blocking portions 29, the part of the blocking portion 29 near the display area AA located outside the cutting reserve area 101 can be bifurcated to form two sub-blocking portions. In the embodiment shown in FIG. 6, the display substrate includes a first blocking portion 291 and a second blocking portion 292 located on a side of the first blocking portion 291 away from the display area AA. The part of the first blocking portion 291 located outside the cutting reserve area 101 is bifurcated to form two sub-blocking portions 293.

Figure 7:
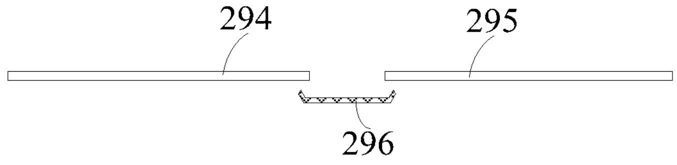
FIG. 7 is a schematic partial structural diagram of a display substrate according to yet another exemplary embodiment of the present disclosure.

In some embodiments, as shown in FIG. 1, the blocking portion 29 is continuous. In other embodiments, the blocking portion 29 is discontinuous, that is, the blocking portion 29 is provided with gaps at some positions. As shown in FIG. 7, the blocking portion 29 includes a first blocking segment 294 and a second blocking segment 295. The first blocking segment 294 and the second blocking segment 295 are spaced, and a gap is formed between the first blocking segment 294 and the second blocking segment 295. The display substrate also includes a buffer portion 296 located on a side of the first blocking segment 294 away from the display area AA. The gap between the first blocking segment 294 and the second blocking segment 295 is opposite to the buffer portion 296. The organic material flows out fast relatively through the gap between the first blocking segment 294 and the second blocking segment 295. After flowing out from the gap, the organic material bypasses the buffer portion 296 and flows out from two sides of the buffer portion 296. The buffer portion 296 can slow down the speed of the organic material flowing out. FIG. 7 only illustrates a partial structure of the blocking portion 29. The blocking part 29 can form gaps at a plurality of places. A buffer portion can be provided on a side of each gap away from the display area AA.

Further, as shown in FIG. 7, two ends of the buffer 296 are bent toward the display area AA, so as to further slow down the speed of the organic material flowing out. The length of the buffer portion 296 can be larger than the size of the gap between the first blocking segment 294 and the second blocking segment 295, so as to more effectively slow down the outflow of the organic material. The buffer part 296 can be wavy, linear, zigzag, arc, etc.

In an embodiment, as shown in FIG. 2, a distance D2 between the blocking portions 29 and the bending area BB is smaller than a distance D1 between the blocking portions 29 and the display area AA. That is, the blocking portions 29 are closer to the bending area BB. In this way, the amount of the organic material in the first organic layer flowing to the blocking portion 29 is relatively small, and the organic material in the first organic layer is less likely to flow through the blocking portion 29.

In some embodiments, as shown in FIG. 2, the distance D1 between the blocking portions 29 and the display area AA is 500 microns to 1500 microns. For example, the distance D1 between the blocking portions 29 and the display area AA is 500 microns, 900 microns, 1000 microns, or 1500 microns.

In some embodiments, as shown in FIG. 2, the distance D2 between the blocking portions 29 and the bending area BB is 400 microns to 1000 microns. For example, the distance D2 between the blocking portions 29 and the bending area BB is 400 microns, 700 microns, 800 microns, or 1000 microns.

Figure 8:
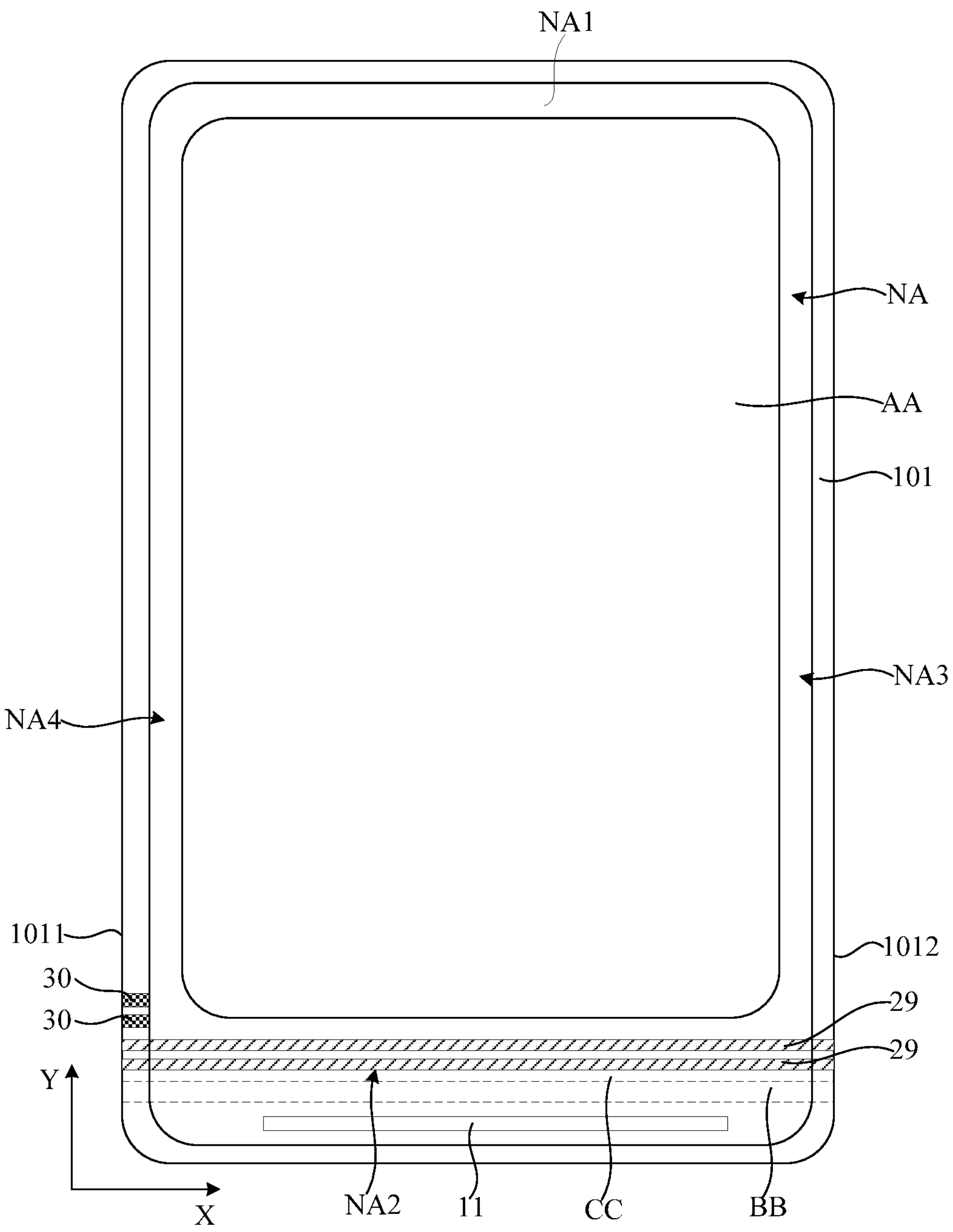
FIG. 8 is a schematic structural diagram of a display substrate according to yet another exemplary embodiment of the present disclosure.
Figure 9:
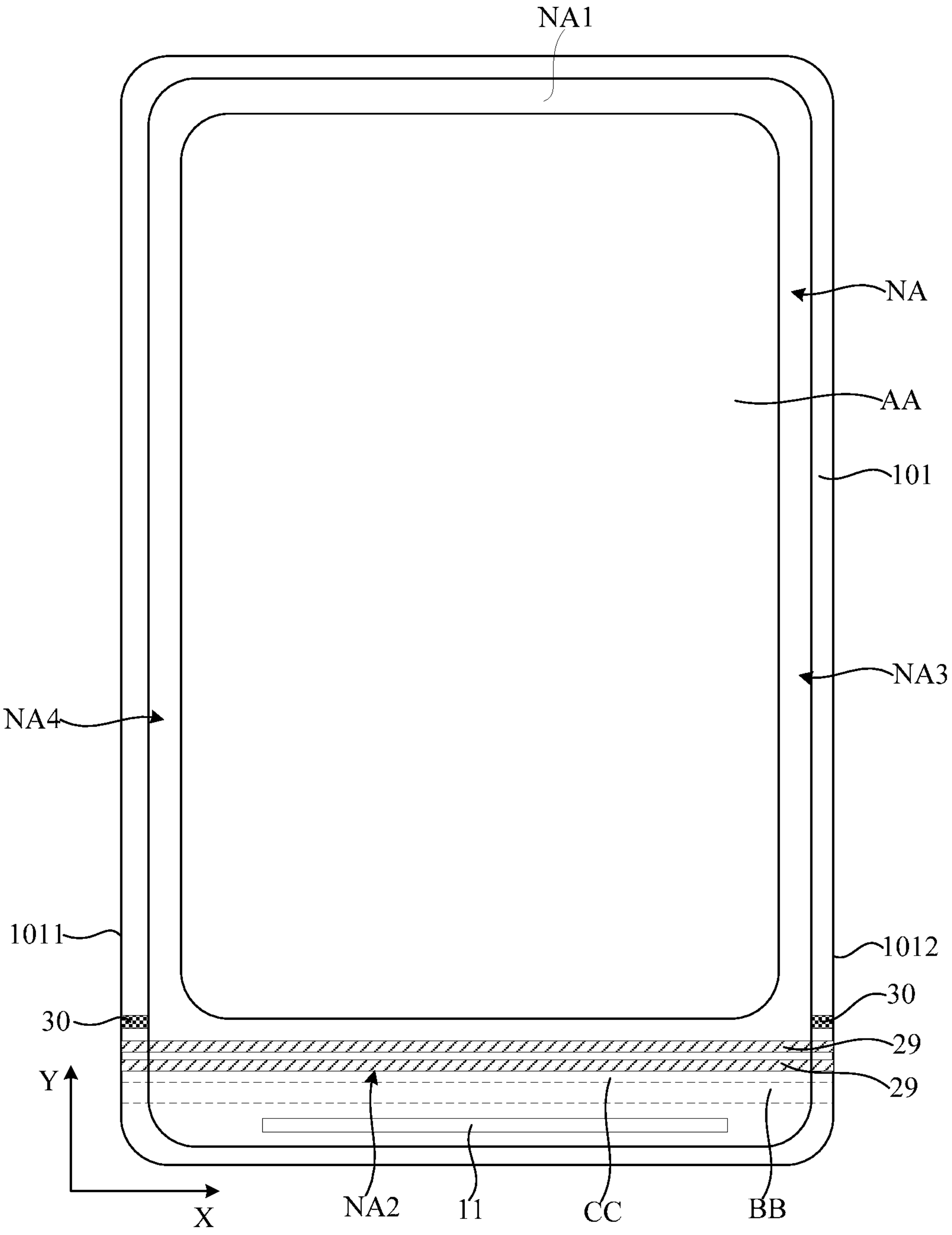
FIG. 9 is a schematic structural diagram of a display substrate according to yet another exemplary embodiment of the present disclosure.

In an embodiment, as shown in FIGS. 8 and 9, the display substrate further includes one or more blocking blocks 30 located in the cutting reserve area 101. The blocking blocks 30 are located on a side of the blocking portion 29 away from the bending area BB. Since the height of the cutting reserve area 101 is smaller than that of other areas, the organic material of the first organic layer is easy to flow into the cutting reserve area 101 and converge in the cutting reserve area 101, resulting in a large flow speed of the organic material located in the cutting reserve area 101. Since the distance between the surface of the part of the blocking portion 29 located in the cutting reserve area 101 away from the base substrate 21 and the base substrate is less than the distance between the surface of the part of the blocking portion 29 located outside the cutting reserve area 101 away from the base substrate 21 and the base substrate, the organic material located in the cutting reserve area can easily cross the part of the blocking portion 29 located in the cutting reserve area 101 and enter the bending area BB. By setting the blocking blocks 30, the blocking blocks 30 can reduce the flow speed of the organic material located in the cutting reserve area 101, avoiding the organic material from crossing the blocking part 29 and entering the bending area BB due to the excessive flow speed of the organic material located in the cutting reserve area 101, thereby improving the yield of the display substrate.

In an embodiment, widths of the blocking blocks 30 are the same as the width of the cutting reserve area 101. In this way, the blocking blocks 30 can more effectively reduce the flow speed of the organic material located in the cutting reserve area 101.

In an embodiment, the blocking blocks 30 include at least one organic layer.

In some embodiments, the material of the blocking blocks 30 is entirely organic. This setting is more helpful in avoiding cracks in the film layer of the blocking blocks 30 during the cutting process, and reducing the difficulty of cutting the cutting area.

In some embodiments, the blocking blocks 30 include a part of at least one of the second organic layer 28, the planarization layer 25, and the pixel defining layer. In this way, the blocking blocks 30 are formed simultaneously with some film layers of the display substrate, and the formation of blocking blocks 30 will not increase the preparation complexity of the display substrate.

In an exemplary embodiment, the blocking blocks 30 include a part of the second organic layer 28. In another exemplary embodiment, the blocking blocks 30 include the planarization layer 25 and a part of the second organic layer 28. In another embodiment, the blocking blocks 30 include the pixel defining layer and a part of the second organic layer 28.

In an embodiment, settings of one or more layers for the blocking blocks 30 and the part of the blocking portion 29 located in the cutting reserve area 101 are the same. In this way, the blocking blocks 30 and the part of the blocking portion 29 located in the cutting reserve area 101 can be formed simultaneously, which helps to simplify the complexity of the preparation process. For example, the blocking blocks 30 and the blocking portion 29 can both include the second organic layer 28 and a part of the planarization layer 25.

In an embodiment, an area of the cutting reserve area 101 located on one side of the display area AA may be provided with two or more spaced blocking blocks 30. In this way, the blocking blocks 30 can more effectively reduce the flow speed of the organic material located in the cutting reserve area 101. As shown in FIG. 8, the area of the cutting reserve area 101 located on one side of the display area AA is provided with two blocking blocks 30. Heights of the two blocking blocks 30 can be the same or different. When the heights of the two blocking blocks 30 are different, and the height of the blocking block 30 near the blocking portion 29 can be greater than the height of the blocking block 30 far away from the blocking portion 29. For example, the blocking block 30 near the blocking portion 29 includes the planarization layer 25 and a part of the second organic layer 28, and the blocking block 30 far away from the blocking portion 29 includes a part of the second organic layer 28.

In an embodiment, as shown in FIG. 8, only one side of the cut reserve area 101 located on the opposite sides of the display area AA may be provided with blocking blocks 30. Or, as shown in FIG. 9, the cutting reserved area 101 is provided with blocking blocks 30 in the areas on the opposite sides of the display area AA.

In an embodiment, as shown in FIG. 2, the display substrate further includes a dam 26 located on the side of the driving circuit layer 22 away from the base substrate 21. The dam 26 is located in the non-display area NA. The dam 26 is used for preventing the organic material for preparing the organic encapsulation layer 242 from overflowing to the non-display area NA during the preparation of the organic encapsulation layer 242.

In some embodiments, as shown in FIG. 2, the dam 26 may be annular. The number of the dam 26 can be two. For example, the display substrate can include a first dam 261 and a second dam 262, with the first dam 261 located on an inner side of the second dam 262. In this way, the dams 26 can more effectively prevent the organic material from overflowing to the non-display area NA during the preparation of organic encapsulation layer 242, and improve the reliability.

In some embodiments, the dam 26 is located on a side of the blocking portion 29 near the display area AA. The dam 26 and the blocking portion 29 do not overlap in a direction perpendicular to the base substrate 21. A distance D3 between the blocking portion 29 and the dam 26 is smaller than the distance between the blocking portion 29 and the bending area BB.

In some embodiments, the dams 26 may be on the same layer as the planarization layer 25, and the material of the dams 26 may be the same as the material of planarization layer 25. In this way, the dams 26 and the planarization layer 25 can be formed simultaneously, which helps to simplify the preparation process of the display substrate.

Figure 10:
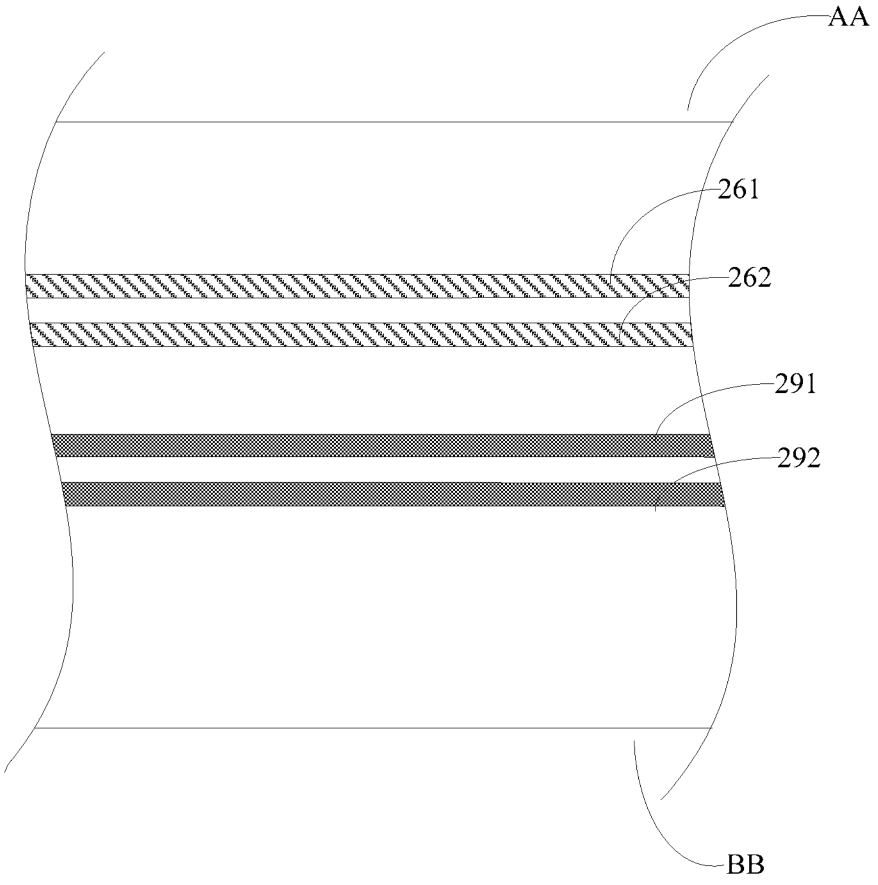
FIG. 10 is a schematic partial structural diagram of a display substrate according to yet another exemplary embodiment of the present disclosure.

In some embodiments, as shown in FIG. 10, the display substrate may include two dams 26: the first dam 261 and the second dam 262, with the first dam 261 located on the inner side of the second dam 262. The display substrate includes two blocking portions 29: the first blocking portion 291 and the second blocking portion 292, with the first blocking portion 291 located on the inner side of the second blocking portion 292. The width of the first blocking portion 291 and the width of the second blocking portion 292 may be approximately the same. A distance between the first obstruction part 291 and the second dam 262 is smaller than a distance between the second obstruction part 292 and the bending part BB. A distance between the first dam 261 and the display area AA is smaller than the distance between the second obstruction part 292 and the bending part BB. The distance between the second dam 262 and the first obstruction part 291 is smaller than the distance between the first dam 261 and the display area AA.

In some embodiments, as shown in FIG. 2, the distance D3 between the blocking portion 29 and the dams 26 is greater than 50 microns. When the number of the dams 26 is two or more, the distance D3 between the blocking portion 29 and the dams 26 is the distance D3 between the blocking portion 29 and the outer dam 26.

An embodiment of the present disclosure also provides a display apparatus, which includes the display substrate as described in any of the above embodiments.

In an embodiment, the display apparatus further includes a cover plate located on a side of the display substrate away from the base substrate.

In an embodiment, the display apparatus further includes a housing, and the display substrate is arranged in the housing.

The display apparatus provided in the embodiment of the present disclosure can be any device with a display function, such as a mobile phone, a tablet computer, a television, a notebook computer and a vehicle-mounted device.

It should be noted that in the drawings, sizes of layers and regions may be exaggerated for clarity of illustration. It will be further noted that in a case that an element or layer is referred to as being "on" other element or layer, it can be directly on the other element or an intervening layer may be present. In addition, it will be noted that in a case that an element or layer is referred to as being "under" other element or layer, it can be directly under the other element, or there may be one or more than one intervening layer or element. In addition, it can further be noted that in a case that a layer or element is referred to as being "between" two layers or two elements, it can be the only layer between the two layers or two elements, or more than one intervening layers or components may further be present. Similar reference signs indicate similar elements throughout the specification.

One of ordinary skill in the art will easily conceive of other embodiments of the present disclosure after considering the specification and practicing the disclosure disclosed herein. The present disclosure is intended to cover any variations, applications, or modifications of the present disclosure. These variations, applications, or modifications follow the general principles of the present disclosure and include common knowledge or conventional technical means in the art that are not disclosed in the present disclosure. The description and the embodiments are to be regarded as exemplary only, and the true scope and spirit of the present disclosure are defined by the appended claims.

The invention claimed is:

1. A display substrate, wherein the display substrate comprises a display area and a non-display area, and the non-display area comprises a bending area; an outer edge area of the non-display area is a cutting reserve area, and at least part of the cutting reserve area is located between the display area and the bending area; the display substrate comprises:

a base substrate;

a light-emitting device layer, located on the base substrate and in the display area;

an encapsulation layer, located on a side of the light-emitting device layer away from the base substrate;

a touch layer, located on a side of the encapsulation layer away from the base substrate;

a first organic layer, located on a side of the touch layer away from the base substrate, and in the display area and the non-display area; and one or more blocking portions located on at least one side of the display area, wherein the one or more blocking portions are located between the display area and the bending area, and are partially located in the cutting reserve area to prevent the first organic layer from entering the bending area;

wherein a distance between a surface of a part of the blocking portion located in the cutting reserve area away from the base substrate and the base substrate is a first distance, a distance between a surface of a part of the blocking portion located outside the cutting reserve area away from the base substrate and the base substrate is a second distance, and the first distance is less than the second distance.

2. The display substrate according to claim 1, wherein the one or more blocking portions are located on a side of the first organic layer away from the display area.

3. The display substrate according to claim 2, wherein heights of the one or more blocking portions are greater than a height of an edge of the first organic layer away from the display area; or, the heights of the one or more blocking portions are smaller than the height of the edge of the first organic layer away from the display area.

4. The display substrate according to claim 1, wherein, in a direction perpendicular to a direction in which the display area pointing to the bending area, the cutting reserve area comprises a first edge and a second edge which are opposite, the first edge and the second edge are located on opposite sides of the non-display area, and the one or more blocking portions extend from the first edge to the second edge.

5. The display substrate according to claim 1, wherein the display substrate comprises a plurality of organic layers, and the part of the blocking portions located in the cutting reserve area comprises at least two organic layers.

6. The display substrate according to claim 5, further comprising a second organic layer located between the touch layer and the first organic layer, a planarization layer located on a side of the touch layer towards the base substrate, and a pixel defining layer comprised in the light-emitting device layer;

wherein the part of the blocking portions located in the cutting reserve area at least comprises a part of at least two of the second organic layer, the planarization layer and the pixel defining layer.

7. The display substrate according to claim 6, wherein the first organic layer is formed by an inkjet printing process, and the second organic layer is made of an organic resin.

8. The display substrate according to claim 1, further comprising one or more blocking blocks located in the cutting reserve area, wherein the one or more blocking blocks are located on a side of the one or more blocking portions away from the bending area.

9. The display substrate according to claim 8, wherein widths of the one or more blocking blocks are the same as a width of the cutting reserve area.

10. The display substrate according to claim 8, wherein settings of one or more layers for the one or more blocking blocks and the one or more blocking portions are the same.

11. The display substrate according to claim 1, wherein the encapsulation layer comprises an organic encapsulation layer at least partially located in the display area; wherein the one or more blocking portions are located on a side of the organic encapsulation layer away from the display area; the organic encapsulation layer comprises a slope portion which is uneven in thickness.

12. The display substrate according to claim 11, wherein the first organic layer comprises an optical compensation portion, a projection of the slope portion on the base substrate is located within a projection of the optical compensation portion on the base substrate, and the optical compensation portion is configured to weaken or eliminate a phenomenon of wave patterns on a display screen caused by the slope portion.

13. The display substrate according to claim 12, wherein sums of a thickness of the optical compensation portion and a thickness of the slope portion at different positions in the display area are the same, a refractive index of the slope portion is the same as a refractive index of the optical compensation portion, and a surface of the optical compensation portion away from the base substrate is parallel to a surface of the base substrate facing the light-emitting device layer.

14. The display substrate according to claim 12, wherein a material of the organic encapsulation layer is the same as a material of the optical compensation portion.

15. The display substrate according to claim 12, wherein the organic encapsulation layer further comprises a first flat portion located in the display area and adjacent to the slope portion, wherein the first flat portion is even in thickness;

the organic encapsulation layer further comprises a second flat portion located in the display area and adjacent to the optical compensation portion, wherein the second flat portion is located on a side of the first flat portion away from the base substrate, and a surface of the second flat portion away from the base substrate is parallel to a surface of the base substrate facing the light-emitting device layer;

sums of a thickness of the first organic layer and a thickness of the organic encapsulation layer at different positions in the display area are the same.

16. The display substrate according to claim 1, wherein the touch layer comprises a first metal layer, an insulating material layer located on a side of the first metal layer away from the base substrate, and a second metal layer located on a side of the insulating material layer away from the base substrate; wherein the insulating material layer covers the first metal layer; the display substrate further comprises a second organic layer located between the touch layer and the first organic layer, wherein the second organic layer is located between the display area and the non-display area and outside the bending area, and the second organic layer covers the second metal layer;

wherein a part of the one or more blocking portions located outside the cutting reserve area comprises a part of at least one of the first metal layer, the insulating material layer, the second metal layer and the second organic layer.

17. The display substrate according to claim 1, wherein a distance between the one or more blocking portions and the bending area is less than a distance between the one or more blocking portions and the display area.

18. The display substrate according to claim 1, wherein the encapsulation layer comprises an organic encapsulation layer at least partially located in the display area, and the display substrate further comprises one or more dams located in the non-display area and on a side of the one or more blocking portions near the display area, wherein the one or more dams are for preventing an organic material for preparing the organic encapsulation layer from overflowing to the non-display area; wherein the one or more dams and the one or more blocking portions do not overlap in a direction perpendicular to the base substrate;

wherein a distance between the one or more blocking portions and the one or more dams is smaller than a distance between the one or more blocking portions and the bending area.

19. A display apparatus, comprising a display substrate, wherein the display substrate comprises a display area and a non-display area, and the non-display area comprises a bending area; an outer edge area of the non-display area is a cutting reserve area, and at least part of the cutting reserve area is located between the display area and the bending area; the display substrate comprises:

a base substrate;

a light-emitting device layer, located on the base substrate and in the display area;

an encapsulation layer, located on a side of the light-emitting device layer away from the base substrate;

a touch layer, located on a side of the encapsulation layer away from the base substrate;

a first organic layer, located on a side of the touch layer away from the base substrate, and in the display area and the non-display area; and one or more blocking portions located on at least one side of the display area, wherein the one or more blocking portions are located between the display area and the bending area, and are partially located in the cutting reserve area to prevent the first organic layer from entering the bending area;

wherein a distance between a surface of a part of the blocking portion located in the cutting reserve area away from the base substrate and the base substrate is a first distance, a distance between a surface of a part of the blocking portion located outside the cutting reserve area away from the base substrate and the base substrate is a second distance, and the first distance is less than the second distance.

* * * * *